United States Patent
Lee

(10) Patent No.: US 10,305,483 B1
(45) Date of Patent: May 28, 2019

(54) RECEIVING CIRCUIT AND INTEGRATED CIRCUIT SYSTEM USING THE RECEIVING CIRCUIT

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/037,644

(22) Filed: Jul. 17, 2018

(30) Foreign Application Priority Data

Dec. 21, 2017 (KR) .......... 10-2017-0176623

(51) Int. Cl.
  *H03K 19/0185* (2006.01)
  *H03K 19/003* (2006.01)
  *H03K 19/0175* (2006.01)

(52) U.S. Cl.
  CPC ........... *H03K 19/018557* (2013.01); *H03K 19/00384* (2013.01); *H03K 19/017545* (2013.01)

(58) Field of Classification Search
  CPC ....... H03K 19/0175; H03K 19/017509; H03K 19/017545; H03K 19/0185; H03K 19/018557
  USPC ........................................ 326/30, 82–83, 86
  See application file for complete search history.

(56) References Cited

U.S. PATENT DOCUMENTS

| | | | |
|---|---|---|---|
| 6,034,551 A * | 3/2000 | Bridgewater, Jr. | G06F 13/4072 326/82 |
| 6,573,764 B1 * | 6/2003 | Taylor | H04L 25/0272 326/82 |
| 6,847,582 B2 | 1/2005 | Pan | |
| 6,894,536 B2 * | 5/2005 | Martin | H04L 25/493 326/63 |
| 7,408,385 B2 * | 8/2008 | Takamuku | H03K 19/018578 326/115 |
| 7,480,263 B2 * | 1/2009 | Junger | H04L 5/16 370/296 |
| 7,825,695 B2 * | 11/2010 | Whetsel | H03K 19/01759 326/86 |
| 8,588,280 B2 | 11/2013 | Oh et al. | |
| 9,209,807 B2 * | 12/2015 | Saito | H03K 19/00361 |
| 9,258,154 B2 * | 2/2016 | Hormati | H04L 25/03343 |
| 2002/0075035 A1 * | 6/2002 | Roth | G01R 31/31924 326/82 |
| 2005/0285620 A1 * | 12/2005 | Wehage | G01R 31/3008 326/16 |
| 2007/0279125 A1 * | 12/2007 | Tripathi | H03K 3/35613 327/563 |
| 2008/0238546 A1 * | 10/2008 | Kim | H03F 3/3022 330/257 |
| 2017/0249894 A1 * | 8/2017 | Tsuchi | G09G 3/2092 |

* cited by examiner

*Primary Examiner* — Jason Crawford
(74) *Attorney, Agent, or Firm* — William Park & Associates Ltd.

(57) ABSTRACT

A receiving circuit includes a first amplification circuit and a second amplification circuit. The first amplification circuit may generate a first output signal by asymmetrically and differentially amplifying first and second signals. The second amplification circuit may generate a second output signal by asymmetrically and differentially amplifying the second and first signals.

21 Claims, 5 Drawing Sheets

| IN1 | IN2 | OUT1 | OUT2 |
|-----|-----|------|------|
| L | L | L | L |
| L | H | L | H |
| H | L | H | L |
| H | H | H | H |

US 10,305,483 B1

RECEIVING CIRCUIT AND INTEGRATED CIRCUIT SYSTEM USING THE RECEIVING CIRCUIT

CROSS-REFERENCES TO RELATED APPLICATION

The present application claims priority under 35 U.S.C. § 119(a) to Korean application number 10-2017-0176623, filed on Dec. 21, 2017, in the Korean Intellectual Property Office, which is incorporated herein by reference in its entirety.

BACKGROUND

1. Technical Field

Various embodiments generally relate to an integrated circuit technology, and, more particularly, to a receiving circuit and an integrated circuit system using the receiving circuit.

2. Related Art

Electronic apparatuses may consist of a large number of electronic components. A computer system, for example, may consist of many integrated circuits constructed using semiconductors. The integrated circuits may communicate with each other by exchanging signals. The transmitted signals may be differential signals or a single-ended signal. Some integrated circuits can include receiving circuits to receive the signals transmitted by other integrated circuits. A general type of receiving circuit is a differential amplifier. A differential amplifier may generate an output signal by differentially amplifying the difference between two input signals.

A single-ended receiving circuit receives an input signal represented by a varying voltage over one line and compares it with a reference voltage received over another line. Use of a reference voltage with a differential amplifier includes the disadvantages of having to both generate and filter the reference voltage, requiring additional components which generate unwanted heat, consume power, result in a larger circuit footprint, and add to manufacturing costs.

SUMMARY

In accordance with an embodiment, a receiving circuit may include a first amplification circuit, which receives a first signal through a first positive input terminal and receives a second signal through a first negative input terminal to generate a first output signal by differentially amplifying the first and second signals. The receiving circuit may also include and a second amplification circuit, which receives the second signal through a second positive input terminal and receives the first signal through a second negative input terminal to generate a second output signal by differentially amplifying the second and first signals. Further, the first positive input terminal and the first negative input terminal are asymmetrical to each other, and the second positive input terminal and the second negative input terminal are asymmetrical to each other.

Also in accordance with an embodiment, a receiving circuit may include a first amplification circuit configured to differentially amplify a first signal and a second signal to generate a first output signal. The first amplification circuit may include a first PMOS transistor, configured to change a voltage level of a first negative output node based on the first signal; a second PMOS transistor, configured to change a voltage level of a first positive output node based on the second signal; a first NMOS transistor, configured to change a voltage level of a second negative output node based on the first signal; and a second NMOS transistor, configured to change a voltage level of the first positive output node based on the second signal. The first output signal is outputted from the first positive output node. Additionally, the first PMOS transistor and the second PMOS transistor are asymmetrical to each other, and the first NMOS transistor and the second NMOS transistor are asymmetrical to each other.

Further in accordance with an embodiment, a receiving circuit may include a first amplification circuit, configured to asymmetrically and differentially amplify a first signal and a second signal and to generate a first output signal corresponding to a voltage level of the first signal without using a reference voltage for determining the voltage level of the first signal. The receiving circuit may also include a second amplification circuit, configured to asymmetrically differentially amplify the second signal and the first signal and to generate a second output signal corresponding to a voltage level of the second signal without using the reference voltage for determining the voltage level of the second signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIG. 5 shows a table to assist in the explanation of the operation of the receiving circuit in accordance with the embodiment.

DETAILED DESCRIPTION

Hereinafter, embodiments of a receiving circuit and an integrated circuit system using the same are described below with reference to the accompanying drawings.

Figure 1:
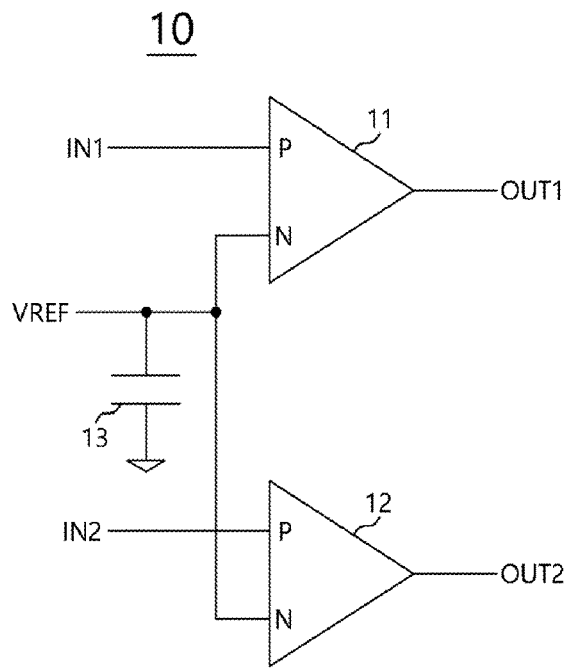
FIG. 1 shows a diagram illustrating a configuration of a receiving circuit according to the conventional art.

FIG. 1 shows a diagram illustrating a configuration of a receiving circuit 10 according to the conventional art. In FIG. 1, the receiving circuit 10 may include a first amplifier 11 and a second amplifier 12. The first amplifier 11 may include a positive input terminal P and a negative input terminal N. The positive input terminal P may receive a first signal IN1, and the negative input terminal N may receive a reference voltage VREF. The first amplifier 11 may differentially amplify the first signal IN1 and the reference voltage VREF and generate a first output signal OUT1. The second amplifier 12 may include a positive input terminal P and a negative input terminal N. The positive input terminal P may receive a second signal IN2, and the negative input terminal N may receive the reference voltage VREF. The second amplifier 12 may differentially amplify the second signal IN2 and the reference voltage VREF and generate a second output signal OUT2. The reference voltage VREF, used to allow the first and second amplifiers 11 and 12 to amplify the first and second signals IN1 and IN2, may have a voltage level corresponding to, for example, half of the swing width of the first and second signals IN1 and IN2. For instance, when the first and second signals IN1 and IN2 are signals which swing between a first level and a second level, the reference voltage VREF may have a voltage level corresponding to half of the sum of the first and second levels.

The first amplifier 11 may be a symmetrical differential amplifier to symmetrically and differentially amplify the first signal IN1 and the reference voltage VREF and generate the first output signal OUT1. The second amplifier 12 may be a symmetrical differential amplifier to symmetrically and differentially amplify the second signal IN2 and the reference voltage VREF and generate the second output signal OUT2. For example, the first amplifier 11 may output the first output signal OUT1 having a high level when the voltage level of the first signal IN1 is higher than the level of the reference voltage VREF, and may output the first output signal OUT1 having a low level when the voltage level of the first signal IN1 is lower than the level of the reference voltage VREF. The second amplifier 12 may output the second output signal OUT2 having a high level when the voltage level of the second signal IN2 is higher than the level of the reference voltage VREF, and may output the second output signal OUT2 having a low level when the voltage level of the second signal IN2 is lower than the level of the reference voltage VREF.

As described above, the receiving circuit 10 uses the reference voltage VREF. The reference voltage VREF may be supplied by an external apparatus or may be generated inside an integrated circuit which includes the receiving circuit 10. The receiving circuit 10 according to the conventional art may have the following problems. First, the conventional art uses the reference voltage VREF as a third signal to receive the first and second signals IN1 and IN2. Therefore, in the case where jitter or noise occurs, it is difficult to receive an accurate signal. In an environment of high speed operation and low power operation, the possibility of jitter or noise increases. Next, since the receiving circuit 10 receives the reference voltage VREF, additional wiring lines as well as a component for generating or providing the reference voltage are needed. Moreover, in order to stabilize the level of the reference voltage VREF, a decoupling to capacitor 13 is generally used. The decoupling capacitor 13 may be coupled with a node to which the reference voltage VREF is inputted. In the case where the decoupling capacitor 13 is used, the level of the reference voltage VREF may be stabilized. However, because an increased number of capacitors or a capacitor of a larger size should be used as the number of amplifiers which use the reference voltage VREF increases, a disadvantage is that a circuit area is increased. Further, additional noise may be introduced into the receiving circuit 10 through the decoupling capacitor 13.

Figure 2:
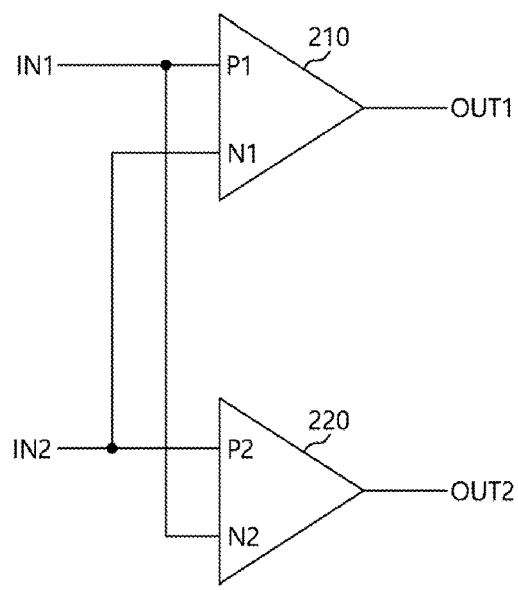
FIG. 2 shows a diagram illustrating a configuration of a receiving circuit in accordance with an embodiment of the present teachings.

FIG. 2 shows a diagram illustrating a receiving circuit 2 in accordance with an embodiment of the present teachings. The receiving circuit 2 may generate output signals OUT1 and OUT2 from input signals IN1 and IN2 without using a reference voltage, such as the reference voltage VREF shown in FIG. 1. The receiving circuit 2 may include two amplification circuits and may generate two output signals from two input signals. In FIG. 2, the receiving circuit 2 may include a first amplification circuit 210 and a second amplification circuit 220. The first amplification circuit 210 may receive a first signal IN1 and a second signal IN2, differentially amplify the first and second signals IN1 and IN2, and generate a first output signal OUT1. The second amplification circuit 220 may receive the second signal IN2 and the first signal IN1, differentially amplify the second and first signals IN2 and IN1, and generate a second output signal OUT2. The first amplification circuit 210 may be an asymmetrical differential amplifier to asymmetrically and differentially amplify the first and second signals IN1 and IN2 and generate the first output signal OUT1. The first amplification circuit 210 may asymmetrically and differentially amplify the first and second signals IN1 and IN2 and generate the first output signal OUT1 corresponding to the logic level of the first signal IN1. The second amplification circuit 220 may be an asymmetrical differential amplifier to asymmetrically and differentially amplify the second and first signals IN2 and IN1 and generate the second output signal OUT2. The second amplification circuit 220 may asymmetrically and differentially amplify the second and first signals IN2 and IN1 and generate the second output signal OUT2 corresponding to the logic level of the second signal IN2.

The first amplification circuit 210 may include a first positive input terminal P1 and a first negative input terminal N1. For some embodiments, positive input terminals correspond to non-inverting terminals, and negative input terminals correspond to inverting terminals. The first signal IN1 may be inputted to the first positive input terminal P1, and the second signal IN2 may be inputted to the first negative input terminal N1. The first positive input terminal P1 and the first negative input terminal N1 may be asymmetric to each other. For example, the loading of the first positive input terminal P1 may be less than the loading of the first negative input terminal N1. For example, the impedance of the first positive input terminal P1 may be less than the impedance of the first negative input terminal N1. As the first positive input terminal P1 and the first negative input terminal N1 are asymmetric to each other, the first amplification circuit 210 may asymmetrically and differentially amplify the first and second signals IN1 and IN2.

The second amplification circuit 220 may include a second positive input terminal P2 and a second negative input terminal N2. The second signal IN2 may be inputted to the second positive input terminal P2, and the first signal IN1 may be inputted to the second negative input terminal N2. Each of the signals IN1 and IN2, for instance, is inputted to the positive input terminal for one of the two amplification circuits 210 and 220 and inputted to the negative input terminal for the other of the two amplification circuits 210 and 220. The second positive input terminal P2 and the second negative input terminal N2 may be asymmetric to each other. For example, the loading of the second positive input terminal P2 may be less than the loading of the second negative input terminal N2. For example, the impedance of the second positive input terminal P2 may be less than the impedance of the second negative input terminal N2. As the second positive input terminal P2 and the second negative input terminal N2 are asymmetric to each other, the second amplification circuit 220 may asymmetrically and differentially amplify the second and first signals IN2 and IN1. The first and second amplification circuits 210 and 220 may have the same configuration for some embodiments and a different configuration for other embodiments. As the first and second amplification circuits 210 and 220 asymmetrically and differentially amplify two received signals, two output signals may be generated from the two received signals without using a reference to voltage, such as the reference voltage VREF shown in FIG. 1. Therefore, the receiving circuit 2, in accordance with an embodiment, does not need to include a circuit for generating a reference voltage VREF and a component, such as a decoupling capacitor, for stabilizing the level of the reference voltage VREF.

Figure 3:
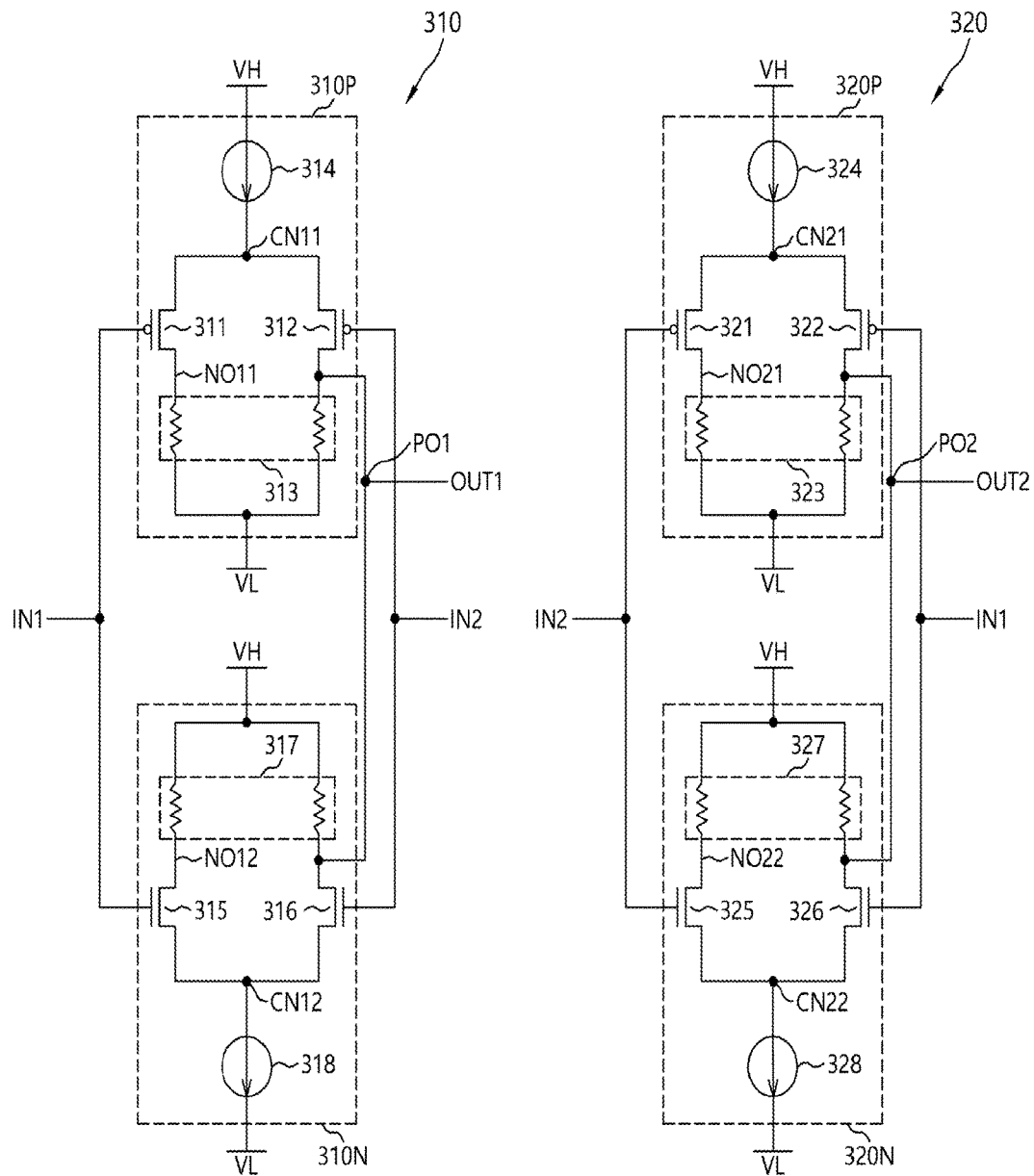
FIG. 3 shows a diagram illustrating a detailed configuration of a receiving circuit in accordance with an embodiment of the present teachings.

FIG. 3 shows a diagram illustrating a detailed configuration of a receiving circuit 3, in accordance with an embodiment. The receiving circuit 3 may include a first amplification circuit 310 and a second amplification circuit 320. Each of the first and second amplification circuits 310 and 320 may perform an asymmetrical differential amplifying operation. The first and second amplification circuits 310 and 320 may be applied as the first and second amplification circuits 210 and 220, respectively, shown in FIG. 2. In FIG. 3, the first amplification circuit 310 may include a first positive input terminal and a first negative input terminal. The first positive input terminal, for example, receives the first signal IN1, and the second negative input terminal receives the second signal IN2. The first amplification circuit 310 may include a P-type amplifier 310P and an N-type amplifier 310N. The P-type amplifier 310P may differentially amplify first and second signals IN1 and IN2 and output a first output signal OUT1 having a low level through a first positive output node PO1. The P-type amplifier 310P may be an asymmetrical differential amplifier. The N-type amplifier 310N may differentially amplify the first and second signals IN1 and IN2 and output the first output signal OUT1 having a high level through the first positive output node PO1. The N-type amplifier 310N may be an asymmetrical differential amplifier.

For some embodiments, the first and second signals IN1 and IN2 are single-ended signals which are independent of each other. In several embodiments, two signals are independent, specifically, functionally independent, when one signal is not a function of the other signal. An inverse or complimentary signal S2 of a primary signal S1, for example, is not independent of the primary signal S1 because the inverse signal S2 is a function of the primary signal, namely: S2=−S2.

The P-type amplifier 310P may include a first input transistor 311 and a second input transistor 312. Each of the first input transistor 311 and the second input transistor 312 may be a PMOS transistor. The first input transistor 311 may change the voltage level of a first negative output node NO11 based on the first signal IN1. The second input transistor 312 may change the voltage level of the first positive output node PO1 based on the second signal IN2. For some embodiments, the first input transistor 311 may be a part of the first positive input terminal P1 shown in FIG. 2, and the second input transistor 312 may be a part of the first negative input terminal N1 shown in FIG. 2.

The first input transistor 311 may receive the first signal IN1 and may be coupled between the first negative output node NO11 and a first common node CN11. The first input transistor 311 may have a gate which receives the first signal IN1, a source which is to coupled with the first common node CN11, and a drain which is coupled with the first negative output node NO11. The second input transistor 312 may receive the second signal IN2 and may be coupled between the first positive output node PO1 and the first common node CN11. The second input transistor 312 may have a gate which is receives the second signal IN2, a source which is coupled with the first common node CN11, and a drain which is coupled with the first positive output node PO1. The first output signal OUT1 may be outputted from the first positive output node PO1. The first common node CN11 may receive a first power supply voltage VH. The first positive output node PO1 and the first negative output node NO11 may receive a second power supply voltage VL. The first power supply voltage VH may be a high voltage. For example, the first power supply voltage VH may be a power supply voltage of an integrated circuit which includes the receiving circuit 3. The second power supply voltage VL may be a low voltage having a level lower than that of the first power supply voltage VH. For example, the second power supply voltage VL may be a ground voltage. The P-type amplifier 310P may further include a passive load 313 which provides the second power supply voltage VL to the first positive output node PO1 and the first negative output node NO11. The passive load 313 may include resistors which couple the first positive output node PO1 and the first negative output node NO11 with the terminal of the second power supply voltage VL. The first common node CN11 may be coupled with a terminal of the first power supply voltage VH through a current source 314.

The first input transistor 311 and the second input transistor 312 may be asymmetric to each other. For example, the size of the first input transistor 311 may be larger than the size of the second input transistor 312. The driving force of the first input transistor 311 may be greater than the driving force of the second input transistor 312. The turn-on resistance value of the first input transistor 311 may be less than the turn-on resistance value of the second input transistor 312. Therefore, when voltages having the same level are applied to the gates of the first input transistor 311 and the second input transistor 312, the current driving force of the first input transistor 311 may be greater than the current driving force of the second input transistor 312.

For some embodiments, the size of a transistor refers to the gate length of the transistor. In other embodiments, the size of a transistor refers to the channel length, width, and/or cross-sectional area for the transistor. In some cases, transistors having different sizes means that the transistors have different operational characteristics from one another.

The N-type amplifier 310N may include a third input transistor 315 and a fourth input transistor 316. Each of the third input transistor 315 and the fourth input transistor 316 may be an NMOS transistor. The third input transistor 315 may change the voltage level of a second negative output node NO12 based on the first signal IN1. The fourth input transistor 316 may change the voltage level of the first positive output node PO1 based on the second signal IN2. For an embodiment, the third input transistor 315 may be a part of the first positive input terminal P1 shown in FIG. 2, and the fourth input transistor 316 may be a part of the first negative input terminal N1 shown in FIG. 2.

The third input transistor 315 may receive the first signal IN1 and may be coupled between the second negative output node NO12 and a second common node CN12. The third input transistor 315 may have a gate which receives the first signal IN1, a drain which is coupled with the second negative output node NO12, and a source which is coupled with the second common node CN12. The fourth input transistor 316 may receive the second signal IN2 and may be coupled between the first positive output node PO1 and the second common node CN12. The fourth input transistor 316 may have a gate which receives the second signal IN2, a drain which is coupled with the first positive output node PO1, and a source which is coupled with the second common node CN12. The second common node CN12 may receive the second power supply voltage VL. The first positive output node PO1 and the second negative output node NO12 may receive the first power supply voltage VH. The N-type amplifier 310N may further include a passive load 317 which provides the first power supply voltage VH to the first positive output node PO1 and the second negative output node NO12. The passive load 317 may include resistors which couple the first positive output node PO1 and the second negative output node NO12 with the terminal of the first power supply voltage VH. The second common node CN12 may be coupled with a terminal of the second power supply voltage VL through a current source 318.

The third input transistor 315 and the fourth input transistor 316 may be asymmetric to each other. For example, the size of the third input transistor 315 may be larger than the size of the fourth input transistor 316. The driving force of the third input transistor 315 may be greater than the driving force of the fourth input transistor 316. The turn-on resistance value of the third input transistor 315 may be less than the turn-on resistance value of the fourth input transistor 316. Therefore, when voltages having the same level are applied to the gates of the third input transistor 315 and the fourth input transistor 316, the current driving force of the third input transistor 315 may be greater than the current driving force of the fourth input transistor 316. In an embodiment, the ratio of the third input transistor 315 and the fourth input transistor 316 may be the same as the ratio of the first input transistor 311 and the second input transistor 312. For example, the size ratio of the third input transistor 315 and the fourth input transistor 316 may be the same as the size ratio of the first input transistor 311 and the second input transistor 312.

In FIG. 3, the second amplification circuit 320 may have substantially the same configuration as the first amplification circuit 310. The second amplification circuit 320 may include a second positive input terminal and a second negative input terminal. The second positive input terminal, for example, receives the second signal IN2, and the second negative input terminal receives the first signal IN1. The second amplification circuit 320 may include a P-type amplifier 320P and an N-type amplifier 320N. The P-type amplifier 320P may differentially amplify the second and first signals IN2 and IN1 and output a second output signal OUT2 having a low level through a second positive output node PO2. The P-type amplifier 320P may be an asymmetrical differential amplifier. The N-type amplifier 320N may differentially amplify the second and first signals IN2 and IN1 and output the second output signal OUT2 having a high level through the second positive output node PO2. The N-type amplifier 320N may be an asymmetrical differential amplifier.

The P-type amplifier 320P may include a first input transistor 321 and a second input transistor 322. Each of the first input transistor 321 and the second input transistor 322 may be a PMOS transistor. The first input transistor 321 may change the voltage level of a first negative output node NO21 based on the second signal IN2. The second input transistor 322 may change the voltage level of the second positive output node PO2 based on the first signal IN1. The first input transistor 321 may be a part of the second positive input terminal P2 shown in FIG. 2, and the second input transistor 322 may be a part of the second negative input terminal N2 shown in FIG. 2.

The first input transistor 321 may receive the second signal IN2 and may be coupled between the first negative output node NO21 and a first common node CN21. The first input transistor 321 may have a gate which receives the second signal IN2, a source which is coupled with the first common node CN21, and a drain which is coupled with the first negative output node NO21. The second input transistor 322 may receive the first signal IN1 and may be coupled between the second positive output node PO2 and the first common node CN21. The second input transistor 322 may have a gate which receives the first signal IN1, a source which is coupled with the first common node CN21, and a drain which is coupled with the second positive output node PO2. The second output signal OUT2 may be outputted from the second positive output node PO2. The first common node CN21 may receive the first power supply voltage VH. The second positive output node PO2 and the first negative output node NO21 may respectively receive the second power supply voltage VL. The P-type amplifier 320P may further include a passive load 323 which provides the second power supply voltage VL to the second positive output node PO2 and the first negative output node NO21. The passive load 323 may include resistors which couple the second positive output node PO2 and the first negative output node NO21 with the terminal of the second power supply voltage VL. The first common node CN21 may be coupled with a terminal of the first power supply voltage VH through a current source 324.

The first input transistor 321 and the second input transistor 322 may be asymmetric to each other. For example, the size of the first input transistor 321 may be larger than the size of the second input transistor 322. The driving force of the first input transistor 321 may be greater than the driving force of the second input transistor 322. The turn-on resistance value of the first input transistor 321 may be less than the turn-on resistance value of the second input transistor 322. Therefore, when voltages having the same level are applied to the gates of the first input transistor 321 and the second input transistor 322, the current driving force of the first input transistor 321 may be greater than the current driving force of the second input transistor 322.

The N-type amplifier 320N may include a third input transistor 325 and a fourth input transistor 326. Each of the third input transistor 325 and the fourth input transistor 326 may be an NMOS transistor. The third input transistor 325 may change the voltage level of a second negative output node NO22 based on the second signal IN2. The fourth input transistor 326 may change the voltage level of the second positive output node PO2 based on the first signal IN1. The third input transistor 325 may be a part of the second positive input terminal P2 shown in FIG. 2, and the fourth input transistor 326 may be a part of the second negative input terminal N2 shown in FIG. 2.

The third input transistor 325 may receive the second signal IN2 and may be coupled between the second negative output node NO22 and a second common node CN22. The third input transistor 325 may have a gate which receives the second signal IN2, a drain which is coupled with the second negative output node NO22, and a source which is coupled with the second common node CN22. The fourth input transistor 326 may receive the first signal IN1 and may be coupled between the second positive output node PO2 and the second common node CN22. The fourth input transistor 326 may have a gate which receives the first signal IN1, a drain which is coupled with the second positive output node PO2, and a source which is coupled with the second common node CN22. The second common node CN22 may receive the second power supply voltage VL. The second positive output node PO2 and the second negative output node NO22 may receive the first power supply voltage VH. The N-type amplifier 320N may further include a passive load 327, which provides the first power supply voltage VH to the second positive output node PO2 and the second negative output node NO22. The passive load 327 may include resistors which couple the second positive output node PO2 and the second negative output node NO22 with the terminal of the first power supply voltage VH. The second common node CN22 may be coupled with a terminal of the second power supply voltage VL through a current source 328.

The third input transistor 325 and the fourth input transistor 326 may be asymmetric to each other. For example, the size of the third input transistor 325 may be larger than the size of the fourth input transistor 326. The driving force of the third input transistor 325 may be greater than the driving force of the fourth input transistor 326. The turn-on resistance value of the third input transistor 325 may be less than the turn-on resistance value of the fourth input transistor 326. Therefore, when voltages having the same level are applied to the gates of the third input transistor 325 and the fourth input transistor 326, the current driving force of the third input transistor 325 may be greater than the current driving force of the fourth input transistor 326. In an embodiment, the ratio of the third input transistor 325 and the fourth input transistor 326 may be the same as the ratio of the first input transistor 321 and the second input transistor 322. For example, the size ratio of the third input transistor 325 and the fourth input transistor 326 may be the same as the size ratio of the first input transistor 321 and the second input transistor 322.

In an embodiment, the first input transistor 311 and the second input transistor 312 of the first amplification circuit 310 may have the same sizes as the first input transistor 321 and the second input transistor 322, respectively, of the second amplification circuit 320. Further, the third input transistor 315 and the fourth input transistor 316 of the first amplification circuit 310 may have the same sizes as the third input transistor 325 and the fourth input transistor 326, respectively, of the second amplification circuit 320. In an embodiment, the first input transistor 311 and the second input transistor 312 of the first amplification circuit 310 may have the same driving force as the first input transistor 321 and the second input transistor 322, respectively, of the second amplification circuit 320. Further, the third input transistor 315 and the fourth input transistor 316 of the first amplification circuit 310 may have the same driving to force as the third input transistor 325 and the fourth input transistor 326, respectively, of the second amplification circuit 320. In an embodiment, the first input transistor 311 and the second input transistor 312 of the first amplification circuit 310 may have the same turn-on resistance values as the first input transistor 321 and the second input transistor 322, respectively, of the second amplification circuit 320. Further, the third input transistor 315 and the fourth input transistor 316 of the first amplification circuit 310 may have the same turn-on resistance values as the third input transistor 325 and the fourth input transistor 326, respectively, of the second amplification circuit 320.

Figure 4:
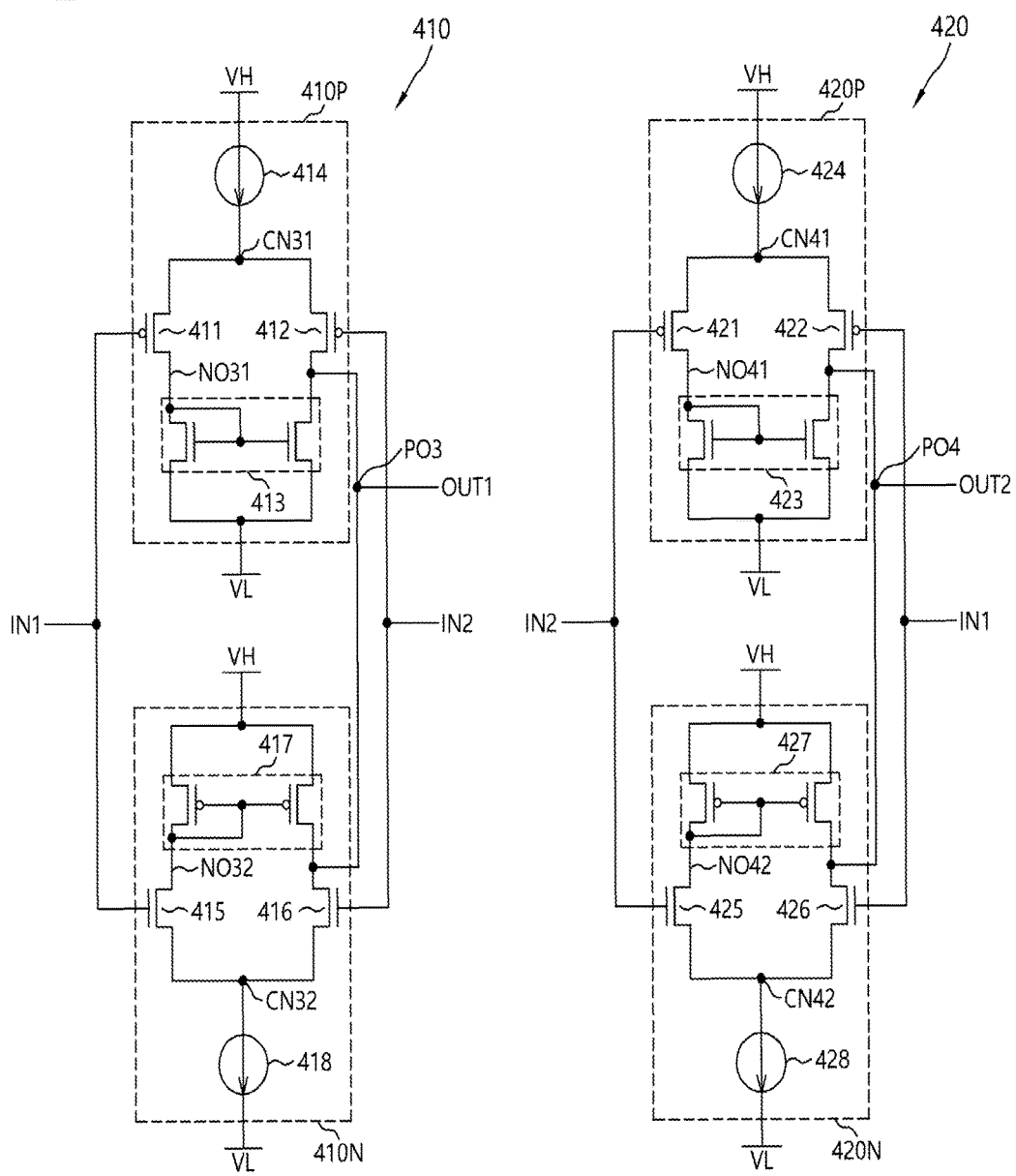
FIG. 4 shows a diagram illustrating a detailed configuration of a receiving circuit in accordance with an embodiment of the present teachings.

FIG. 4 shows a diagram illustrating a detailed configuration of a receiving circuit 4, in accordance with another embodiment. The receiving circuit 4 may include a first amplification circuit 410 and a second amplification circuit 420. The first and second amplification circuits 410 and 420 may be applied as the first and second amplification circuits 210 and 220, respectively, shown in FIG. 2. In FIG. 4, each of the first and second amplification circuits 410 and 420 may perform an asymmetrical differential amplifying operation. The first and second amplification circuits 410 and 420 may have substantially the same configuration except that signals inputted thereto and signals outputted therefrom are different. The first and second amplification circuits 410 and 420 may have similar configurations as the first and second amplification circuits 310 and 320, respectively, shown in FIG. 3.

The first amplification circuit 410 may include a P-type amplifier 410P and an N-type amplifier 410N. The P-type amplifier 410P may include first and second input transistors 411 and 412. The first input transistor 411 may have a gate which receives a first signal IN1, a source which is coupled with a first common node CN31, and a drain which is coupled with a first negative output node NO31. The second input transistor 412 may have a gate which receives a second signal IN2, a source which is coupled with the first common node CN31, and a drain which is coupled with a first positive output node PO3. A first output signal OUT1 may be outputted from the first positive output node PO3. The P-type amplifier 410P may further include an active load 413. The P-type amplifier 410P may apply a second power supply voltage VL to the first positive output node PO3 and the first negative output node NO31 through the active load 413. The active load 413 may be a component which replaces the passive load 313 shown in FIG. 3. For example, the active load 413 may be a current mirror. The first common node CN31 may be coupled with a terminal of a first power supply voltage VH through a current source 414.

The N-type amplifier 410N may include third and fourth input transistors 415 and 416. The third input transistor 415 may have a gate which receives the first signal IN1, a drain which is coupled with a second negative output node NO32, and a source which is coupled with a second common node CN32. The fourth input transistor 416 may have a gate which receives the second signal IN2, a drain which is coupled with the first positive output node PO3, and a source which is coupled with the second common node CN32. The first output signal OUT1 may be outputted from the first positive output node PO3. The N-type amplifier 410N may further include an active load 417. The N-type amplifier 410N may apply the first power supply voltage VH to the first positive output node PO3 and the second negative output node NO32 through the active load 417. The active load 417 may be a component which replaces the passive load 317 shown in FIG. 3. For example, the active load 417 may be a current mirror. The second common node CN32 may be coupled with a terminal of the second power supply voltage VL through a current source 418.

The second amplification circuit 420 may include a P-type amplifier 420P and an N-type amplifier 420N. The P-type amplifier 420P may include first and second input transistors 421 and 422. The first input transistor 421 may have a gate which receives the second signal IN2, a source which is coupled with a first common node CN41, and a drain which is coupled with a first negative output node NO41. The second input transistor 422 may have a gate which receives the first signal IN1, a source which is coupled with the first common node CN41, and a drain which is coupled with a second positive output node PO4. A second output signal OUT2 may be outputted from the second positive output node PO4. The P-type amplifier 420P may further include an active load 423. The P-type amplifier 420P may apply the second power supply voltage VL to the second positive output node PO4 and the first negative output node NO41 through the active load 423. The active load 423 may be a component which replaces the passive load 323 shown in FIG. 3. For example, the active load 423 may be a current mirror. The first common node CN41 may be coupled with a terminal of the first power supply voltage VH through a current source 424.

The N-type amplifier 420N may include third and fourth input transistors 425 and 426. The third input transistor 425 may have a gate which receives the second signal IN2, a drain which is coupled with a second negative output node NO42, and a source which is coupled with a second common node CN42. The fourth input transistor 426 may have a gate which receives the first signal IN1, a drain which is coupled with the second positive output node PO4 and a source which is coupled with the second common node CN42. The second output signal OUT2 may be outputted from the second positive output node PO4. The N-type amplifier 420N may further include an active load 427. The N-type amplifier 420N may apply the first power supply voltage VH to the second positive output node PO4 and the second negative output node NO42 through the active load 427. The active load 427 may be a component which replaces the passive load 327 shown in FIG. 3. For example, the active load 427 may be a current mirror. The second common node CN42 may be coupled with a terminal of the second power supply voltage VL through a current source 428.

Figure 5:
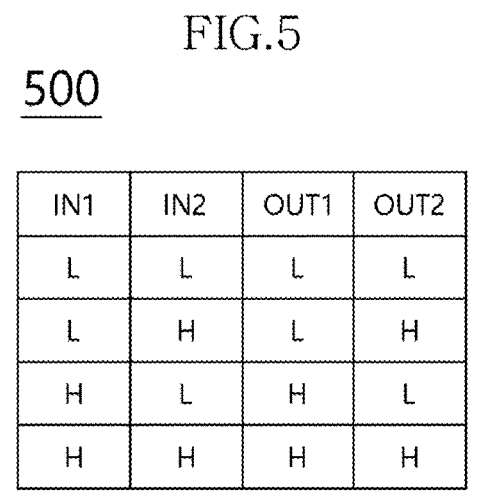

FIG. 5 shows a table 500 to assist in the explanation of the operation of the receiving circuit 3 of FIG. 3, in accordance with an embodiment. The operation of the receiving circuit 3 in accordance with the embodiment is described below with reference to FIGS. 3 and 5. In accordance with the first row of the table 500, when the first signal IN1 is at a low level and the second signal IN2 is at a low level, the N-type amplifiers 310N and 320N of the first and second amplification circuits 310 and 320, respectively, do not perform amplifying operations, and the P-type amplifiers 310P and 320P of the first and second amplification circuits 310 and 320, respectively, may perform amplifying operations. The first and second input transistors 311 and 312 of the P-type amplifier 310P may be turned on based on the first and second signals IN1 and IN2, respectively, and, also, the first and second input transistors 321 and 322 of the P-type amplifier 320P may be turned on based on the second and first signals IN2 and IN1, respectively. Since the sizes of the first input transistors 311 and 321 are larger than the sizes of the second input transistors 312 and 322, the amounts of current flowing through the first input transistors 311 and 321 may be greater than the amounts of current flowing through the second input transistors 312 and 322. Therefore, the first positive output node PO1 may have a level relatively lower than that of the first negative output node NO11, and the first output signal OUT1 having the low level may be generated through the first positive output node PO1. Similarly, the second positive output node PO2 may have a level relatively lower than that of the first negative output node NO21, and the second output signal OUT2 having the low level may be generated through the second positive output node PO2.

In accordance with the second row of the table 500, when the first signal IN1 is at the low level and the second signal IN2 is a high level, the first input transistor 311 of the P-type amplifier 310P and the fourth input transistor 316 of the N-type amplifier 310N may be turned on. The second input transistor 312 of the P-type amplifier 310P and the third input transistor 315 of the N-type amplifier 310N may be turned off. Therefore, the first output signal OUT1 having the low level may be generated through the first positive output node PO1. Further, the second transistor 322 of the P-type amplifier 320P and the third transistor 325 of the N-type amplifier 320N may be turned on, and the first input transistor 321 of the P-type amplifier 320P and the fourth input transistor 326 of the N-type amplifier 320N may be turned off. Therefore, the second output signal OUT2 having the high level may be generated through the second positive output node PO2.

In accordance with the third row of the table 500, when the first signal IN1 is a high level and the second signal IN2 is the low level, the second input transistor 312 of the P-type amplifier 310P and the third input transistor 315 of the N-type amplifier 310N may be turned on. The first input transistor 311 of the P-type amplifier 310P and the fourth input transistor 316 of the N-type amplifier 310N may be turned off. Therefore, the first output signal OUT1 having the high level may be generated through the first positive output node PO1. Further, the first transistor 321 of the P-type amplifier 320P and the fourth transistor 326 of the N-type amplifier 320N may be turned on, and the second input transistor 322 of the P-type amplifier 320P and the third input transistor 325 of the N-type amplifier 320N may be turned off. Therefore, the second output signal OUT2 having the low level may be generated through the second positive output node PO2.

Figure 6:
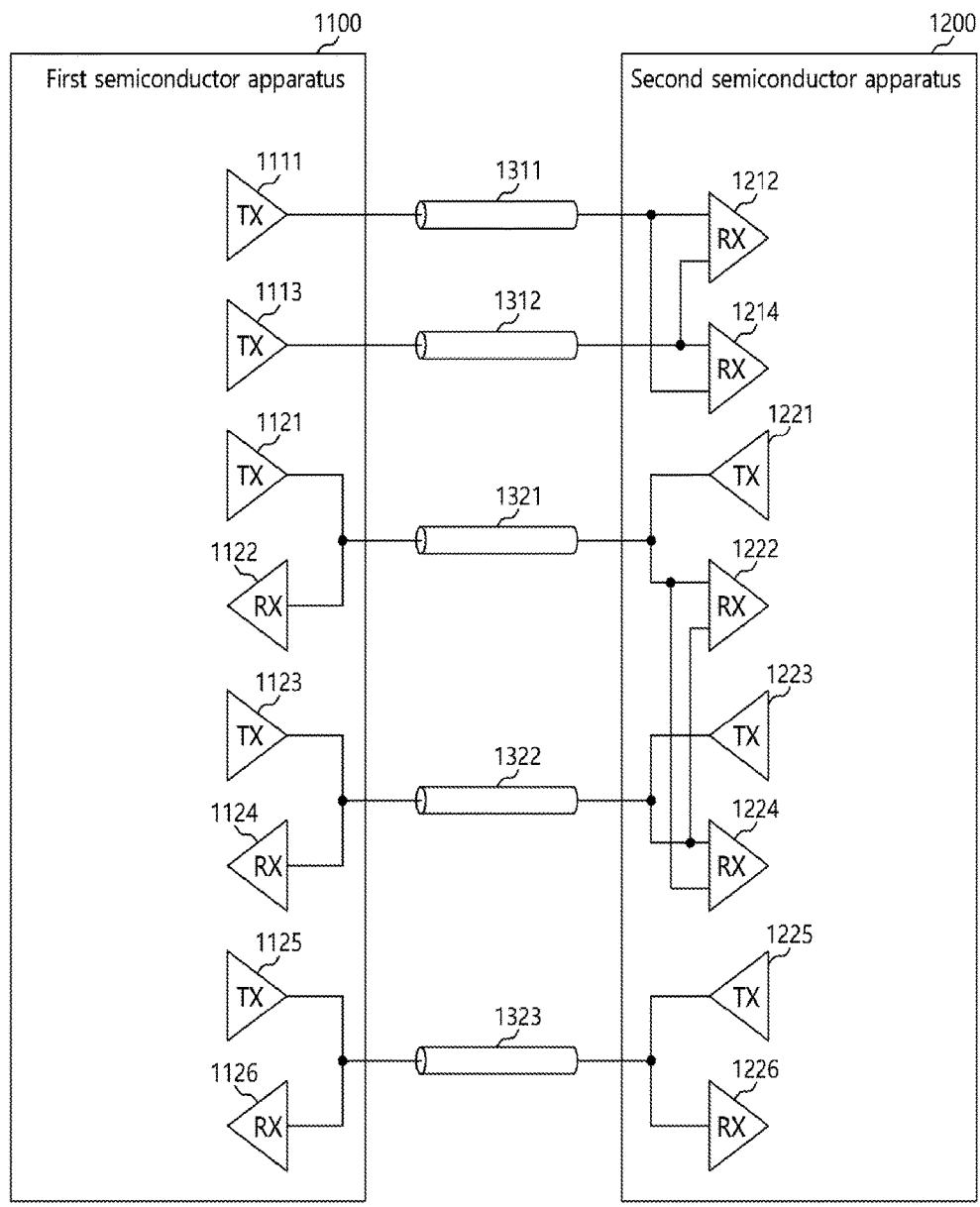
FIG. 6 shows a diagram illustrating a configuration of an integrated circuit system in accordance with an embodiment of the present teachings.

In accordance with the fourth row of the table 500, when both the first signal IN1 and the second signal IN2 are the high levels, the P-type amplifiers 310P and 320P of the first and second amplification circuits 310 and 320 do not perform amplifying operations, and the N-type amplifiers 310N and 320N of the first and second amplification circuits 310 and 320 may perform amplifying operations. The third and fourth input transistors 315 and 316 of the N-type amplifier 310N may be turned on based on the first and second signals IN1 and IN2, and, also, the third and fourth input transistors 325 and 326 of the N-type amplifier 320N may be turned on based on the second and first signals IN2 and IN1. Since the sizes and/or driving force of the third input transistors 315 and 325 is larger than the sizes and/or driving force of the fourth input transistors 316 and 326, the amounts of current flowing through the third input transistors 315 and 325 may be greater than the amounts of current flowing through the fourth input transistors 316 and 326. Therefore, the first positive output node PO1 may have a level relatively higher than that of the second negative output node NO12, and the first output signal OUT1 having the high level may be generated through the first positive output node PO1. Similarly, the second positive output node PO2 may have a level relatively higher than that of the second negative output node NO22, and the second output signal OUT2 having the high level may be generated through the second positive output node PO2. As is apparent from the above descriptions, in the receiving circuit in accordance with the embodiment, since two input terminals are asymmetric and perform an asymmetrical differential amplifying operation, two output signals corresponding to the voltage levels of two signals which are received may be generated even without using a reference voltage FIG. 6 shows a diagram illustrating a configuration of an integrated circuit system 1000, in accordance with an embodiment. For an embodiment, the integrated circuit system 1000 may be a semiconductor system. The integrated circuit system 1000 may include, for example, a first semiconductor apparatus 1100 and a second semiconductor apparatus 1200. The first semiconductor apparatus 1100 may provide various control signals used in the operation of the second semiconductor apparatus 1200. The first semiconductor apparatus 1100, in different embodiments, can be various kinds of apparatuses. For example, the first semiconductor apparatus 1100 may be: a host apparatus such as a central processing unit (CPU); a graphic processing unit (GPU); a multimedia processor (MMP); a digital signal processor; an application processor (AP); or a memory controller. The first semiconductor apparatus 1100 may also be a test apparatus or test equipment for testing the second semiconductor apparatus 1200. The second semiconductor apparatus 1200 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM). The nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM), or an FRAM (ferroelectric RAM).

The integrated circuit system 1000 may include a plurality of buses, and the first and second semiconductor apparatuses 1100 and 1200 may be coupled with each other through the plurality of buses. The plurality of buses may include unidirectional buses and bidirectional buses. A plurality of signals may be transmitted through the plurality of buses. The unidirectional buses may include a clock bus, a command bus, and an address bus, with a clock signal, a command signal, and an address signal being transmitted through the unidirectional buses. The bidirectional buses may include a data bus and a data strobe bus, with data and a data strobe signal being transmitted through the bidirectional buses.

In FIG. 6, the integrated circuit system 1000 may include first and second unidirectional buses 1311 and 1312. The first semiconductor apparatus 1100 may transmit signals to the second semiconductor apparatus 1200 through the first and second unidirectional buses 1311 and 1312, and the second semiconductor apparatus 1200 may receive the signals transmitted through the first and second unidirectional buses 1311 and 1312. The first semiconductor apparatus 1100 may include transmitters 1111 and 1113 for transmitting signals to the first and second unidirectional buses 1311 and 1312, respectively, and the second semiconductor apparatus 1200 may include receivers 1212 and 1214 for receiving the signals transmitted through the first and second unidirectional buses 1311 and 1312, respectively. Single-ended signals may be transmitted through the first and second unidirectional buses 1311 and 1312. The receiving circuits 2, 3, and 4 shown in FIGS. 2, 3, and 4, respectively, may be applied as the receivers 1212 and 1214. The receiver 1212 may asymmetrically and differentially amplify the signals transmitted through the first and second unidirectional buses 1311 and 1312, and the receiver 1214 may asymmetrically and differentially amplify the signals transmitted through the second and first unidirectional buses 1312 and 1311.

The integrated circuit system 1000 may include first to third bidirectional buses 1321, 1322, and 1323. The first semiconductor apparatus 1100 may include transmitters 1121, 1123, and 1125 and receivers 1122, 1124, and 1126, which are coupled with the first to third bidirectional buses 1321, 1322, and 1323, respectively. The second semiconductor apparatus 1200 may include transmitters 1221, 1223, and 1225 and receivers 1222, 1224, and 1226, which are coupled with the first to third bidirectional buses 1321, 1322, and 1323, respectively. Single-ended signals may be transmitted through the first to third bidirectional buses 1321, 1322, and 1323. The receiving circuits 2, 3, and 4 shown in FIGS. 2, 3, and 4, respectively, may be applied as the receiver 1222, which is coupled with the first bidirectional bus 1321, and the receiver 1224, which is coupled with the second bidirectional bus 1322. The receiver 1222 may asymmetrically and differentially amplify the signals transmitted through the first and second bidirectional buses 1321 and 1322, and the receiver 1224 may asymmetrically and differentially amplify the signals transmitted through the second and first bidirectional buses 1322 and 1321. The receiving circuits 2, 3, and 4 shown in FIGS. 2, 3, and 4, respectively, may be applied to the integrated circuit system 1000 in a variety of ways. For example, the receiving circuits 2, 3, and 4 may be applied as the receivers 1224 and 1226 of the second semiconductor apparatus 1200, which are coupled with the second and third bidirectional buses 1322 and 1323, and may be applied as the receivers 1122 and 1124 of the first semiconductor apparatus 1100, which are coupled with the first and second bidirectional buses 1321 and 1322.

While various embodiments have been described herein, it will be understood to those skilled in the art that the described embodiments are examples only and represent only a subset of possible embodiments in accordance with the scope and spirit of the claims provided below. Accordingly, the receiving circuit and the integrated circuit system using the same described herein should not be limited based on the described embodiments.

What is claimed is:

1. A receiving circuit comprising:
   a first amplification circuit configured to receive a first signal through a first positive input terminal of the first amplification circuit, receive a second signal through a first negative input terminal of the first amplification circuit, and generate a first output signal by differentially amplifying the first and second signals; and
   a second amplification circuit configured to receive the second signal through a second positive input terminal of the second amplification circuit, receive the first signal through a second negative input terminal of the second amplification circuit, and generate a second output signal by differentially amplifying the second and first signals,
   wherein the first positive input terminal and the first negative input terminal have different impedances from each other, and the second positive input terminal and the second negative input terminal have different impedances from each other.

2. The receiving circuit according to claim 1, wherein the first amplification circuit comprises:
   a P-type amplifier configured to amplify the first and second signals and to output the first output signal, which has a low level, through a first positive output node; and
   an N-type amplifier configured to differentially amplify the first and second signals and to output the first output signal, which has a high level, through the first positive output node.

3. The receiving circuit according to claim 2, wherein the P-type amplifier comprises:
   a first input transistor configured to receive the first signal and change a voltage level of a first negative output node; and
   a second input transistor configured to receive the second signal and change a voltage level of the first positive output node,
   wherein a size of the first input transistor is larger than a size of the second input transistor.

4. The receiving circuit according to claim 2, wherein the N-type amplifier comprises:
a third input transistor configured to receive the first signal and change a voltage level of a second negative output node; and
a fourth input transistor configured to receive the second signal and change a voltage level of the first positive output node,
wherein a size of the third input transistor is larger than a size of the fourth input transistor.

5. The receiving circuit according to claim 1, wherein the second amplification circuit comprises:
a P-type amplifier configured to amplify the second and first signals and to output the second output signal, which has a low level, through a second positive output node; and
an N-type amplifier configured to amplify the second and first signals and to output the second output signal, which has a high level, through the second positive output node.

6. The receiving circuit according to claim 5, wherein the P-type amplifier comprises:
a first input transistor configured to change a voltage level of a first negative output node based on the second signal; and
a second input transistor configured to change a voltage level of the second positive output node based on the first signal,
wherein a size of the first input transistor is larger than a size of the second input transistor.

7. The receiving circuit according to claim 5, wherein the N-type amplifier comprises:
a third input transistor configured to change a voltage level of a second negative output node based on the second signal; and
a fourth input transistor configured to change a voltage level of the second positive output node based on the first signal,
wherein a size of the third input transistor is larger than a size of the fourth input transistor.

8. The receiving circuit according to claim 1, wherein the first and second signals are single-ended signals which are independent of each other.

9. A receiving circuit comprising:
a first amplification circuit configured to differentially amplify a first signal and a second signal and to generate a first output signal, the first amplification circuit comprising:
a first PMOS transistor configured to change a voltage level of a first negative output node based on the first signal;
a second PMOS transistor configured to change a voltage level of a first positive output node based on the second signal;
a first NMOS transistor configured to change a voltage level of a second negative output node based on the first signal; and
a second NMOS transistor configured to change a voltage level of the first positive output node based on the second signal,
wherein the first output signal is outputted from the first positive output node, the first PMOS transistor and the second PMOS transistor are asymmetric to each other, and the first NMOS transistor and the second NMOS transistor are asymmetric to each other.

10. The receiving circuit according to claim 9, wherein a turn-on resistance value of the first PMOS transistor is less than a turn-on resistance value of the second PMOS transistor, and a turn-on resistance value of the first NMOS transistor is less than a turn-on resistance value the second NMOS transistor.

11. The receiving circuit according to claim 9, wherein a size of the first PMOS transistor is larger than a size of the second PMOS transistor, and a size of the first NMOS transistor is larger than a size of the second NMOS transistor.

12. The receiving circuit according to claim 9, wherein a driving force of the first PMOS transistor is greater than a driving force of the second PMOS transistor, and a driving force of the first NMOS transistor is greater than a driving force of the second NMOS transistor.

13. The receiving circuit according to claim 9, further comprising:
a second amplification circuit configured to differentially amplify the second signal and the first signal and to generate a second output signal, the second amplification circuit comprising:
a third PMOS transistor configured to change a voltage level of a third negative output node based on the second signal;
a fourth PMOS transistor configured to change a voltage level of a second positive output node based on the first signal;
a third NMOS transistor configured to change a voltage level of a fourth negative output node based on the second signal; and
a fourth NMOS transistor configured to change a voltage level of the second positive output node based on the first signal,
wherein the second output signal is outputted from the second positive output node, the third PMOS transistor and the fourth PMOS transistor are asymmetric to each other, and the third NMOS transistor and the fourth NMOS transistor are asymmetric to each other.

14. The receiving circuit according to claim 13, wherein a turn-on resistance value of the third PMOS transistor is less than a turn-on resistance value of the fourth PMOS transistor, and a turn-on resistance value of the third NMOS transistor is less than a turn-on resistance value of the fourth NMOS transistor.

15. The receiving circuit according to claim 13, wherein a size of the third PMOS transistor is larger than a size of the fourth PMOS transistor, and a size of the third NMOS transistor is larger than a size of the fourth NMOS transistor.

16. The receiving circuit according to claim 13, wherein a driving force of the third PMOS transistor is greater than a driving force of the fourth PMOS transistor, and a driving force of the third NMOS transistor is greater than a driving force of the fourth NMOS transistor.

17. A receiving circuit comprising:
a first amplification circuit configured to asymmetrically and differentially amplify a first signal and a second signal and to generate a first output signal; and
a second amplification circuit configured to asymmetrically and differentially amplify the second signal and the first signal and to generate a second output signal,
wherein the first signal and the second signal are single-ended signals which are independent of each other,
wherein the first and second output signals have the same logic levels when the first and second input signals have the same logic levels, and
wherein the first and second output signals have different logic levels when the first and second input signals have different logic levels.

18. The receiving circuit of claim 17, wherein the first amplification circuit generates the first output signal corresponding to the voltage level of the first signal without using a reference voltage for determining the voltage level of the first signal; and wherein the second amplification circuit generates the second output signal corresponding to the voltage level of the second signal without using the reference voltage for determining the voltage level of the second signal.

19. The receiving circuit according to claim 17, wherein the first signal is inputted to a non-inverting input terminal of the first amplification circuit and to an inverting input terminal of the second amplification circuit, and wherein the second signal is inputted to an inverting input terminal of the first amplification circuit and to a non-inverting input terminal of the second amplification circuit, and wherein the first signal and the second signal are different from each other.

20. The receiving circuit according to claim 19, wherein an impedance of the non-inverting input terminal of the first amplification circuit is less than an impedance of the inverting input terminal of the first amplification circuit.

21. The receiving circuit according to claim 19, wherein an impedance of the non-inverting input terminal of the second amplification circuit is less than an impedance of the inverting input terminal of the second amplification circuit.

\* \* \* \* \*